(12) United States Patent
Wang et al.

(10) Patent No.: US 10,036,906 B2
(45) Date of Patent: Jul. 31, 2018

(54) DISPLAY PANEL AND A MANUFACTURING METHOD THEREOF, A TFT TEST METHOD

(71) Applicant: Boe Technology Group Co., Ltd., Beijing (CN)

(72) Inventors: Zuqiang Wang, Beijing (CN); Guang Li, Beijing (CN); Liang Sun, Beijing (CN); Xiaoyong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/322,549

(22) PCT Filed: Apr. 15, 2016

(86) PCT No.: PCT/CN2016/079375
§ 371 (c)(1),
(2) Date: Dec. 28, 2016

(87) PCT Pub. No.: WO2016/197701
PCT Pub. Date: Dec. 15, 2016

(65) Prior Publication Data
US 2017/0168330 A1    Jun. 15, 2017

(30) Foreign Application Priority Data
Jun. 8, 2015    (CN) .......................... 2015 1 0310072

(51) Int. Cl.
*G02F 1/13*    (2006.01)
*G02F 1/1362*    (2006.01)
(Continued)

(52) U.S. Cl.
CPC ....... *G02F 1/1309* (2013.01); *G01R 31/2825* (2013.01); *G02F 1/1368* (2013.01);
(Continued)

(58) Field of Classification Search
CPC ... G02F 1/1309; G02F 1/1368; H01L 27/3262
See application file for complete search history.

(56) References Cited

U.S. PATENT DOCUMENTS

| 2009/0311824 A1 | 12/2009 | Shin et al. |
| 2011/0050660 A1 | 3/2011 | Kim et al. |
| 2014/0354285 A1 | 12/2014 | Kim et al. |

FOREIGN PATENT DOCUMENTS

| CN | 102005166 A | 4/2011 |
| CN | 102750903 | 10/2012 |

(Continued)

OTHER PUBLICATIONS

First Office Action for Chinese Patent Application No. 201510310072.0 dated Jul. 4, 2017.
(Continued)

*Primary Examiner* — Joseph L Williams
(74) *Attorney, Agent, or Firm* — Calfee, Halter & Griswold LLP (57) ABSTRACT

A display panel which includes a display area and a peripheral area around the display area is provided. The peripheral area includes an electroluminescent layer test region, a TFT test region and a plurality of lead-out lines. The electroluminescent layer test region includes a plurality of thin film transistors having electroluminescent layers, a first test line connecting sources of the plurality of thin film transistors having electroluminescent layers, and a switch lead and a second test line connecting gates of the plurality of thin film transistors having electroluminescent layers. The TFT test region includes a plurality of thin film transistors. Each of the plurality of lead-out lines is used for connecting a source-drain metal layer of one thin film transistor in the electroluminescent layer test region and a source-drain metal layer of one thin film transistor in the TFT test region.

15 Claims, 4 Drawing Sheets (51) Int. Cl.
   *G02F 1/1333* (2006.01)
   *H01L 27/32* (2006.01)
   *G01R 31/28* (2006.01)
   *G02F 1/1368* (2006.01)

(52) U.S. Cl.
   CPC .. *G02F 1/133345* (2013.01); *G02F 1/136286* (2013.01); *H01L 27/3262* (2013.01); *G02F 2001/136254* (2013.01); *G02F 2001/136295* (2013.01); *H01L 2227/323* (2013.01)

(56) References Cited

FOREIGN PATENT DOCUMENTS

| | | |
|---|---|---|
| CN | 102750903 A | 10/2012 |
| CN | 103700668 | 4/2014 |
| CN | 104217671 A | 12/2014 |
| CN | 104992960 | 10/2015 |

OTHER PUBLICATIONS

International Search Report for PCT/CN2016/079375 dated Jul. 20, 2016.
Second Office Action for Chinese Patent Application No. 201510310072.0 dated Dec. 4, 2017.

DISPLAY PANEL AND A MANUFACTURING METHOD THEREOF, A TFT TEST METHOD

The present application is the U.S. national phase entry of PCT/CN2016/079375, with an international filing date of Apr. 15, 2016, which claims the benefit of Chinese Patent Application No. 201510310072.0, filed on Jun. 8, 2015, the entire disclosure of which is incorporated herein by reference.

TECHNICAL FIELD

The present application relates to the field of liquid crystal panel displays, particularly to a display panel and a manufacturing method thereof, as well as a TFT test method.

BACKGROUND

With the gradual improvement of people's living standard, people's requirement on the display quality also becomes higher and higher. In the prior art, the technology of the liquid crystal display (LCD) has been very mature and the liquid crystal display has also been widely used. For example, the display screens of mobile phones, cameras, computers and televisions and so on all use liquid crystal displays. Objectively speaking, people's great demand on products pushes the development of the display technology and new display technologies come up constantly, such as the display technologies of low temperature polysilicon (LTPS), organic diode (OLED). The active matrix organic light emitting diode panel (AMOLED) is the key development object of the display technology of the next generation. The active matrix organic light emitting diode panel, compared with the active matrix liquid crystal display (AM-LCD), has significant improvements in terms of image quality, efficiency and cost.

The low temperature polysilicon, compared with the conventional amorphous silicon (a-Si), has many advantages. However, in the conventional manufacturing technology of a panel with thin film transistors of low temperature polysilicon, the short range uniformity of the thin film transistor is relatively less tested. Moreover, the display effect of the electroluminescent layer and the electrical characteristic of the thin film transistor cannot be evaluated comprehensively.

SUMMARY

Embodiments of the present application provide a display panel and a manufacturing method thereof, as well as a TFT test method, for evaluating the display effect of the electroluminescent layer in the display panel, and the electrical characteristics including short range uniformity and so on of the thin film transistor comprehensively.

An aspect of the present application provides a display panel, comprising a display area and a peripheral area around the display area. The peripheral area comprises: an electroluminescent layer test region, a TFT test region and a plurality of lead-out lines.

The electroluminescent layer test region comprises a plurality of thin film transistors having electroluminescent layers, a first test line connecting sources of the plurality of thin film transistors having electroluminescent layers, and a switch lead and a second test line connecting gates of the plurality of thin film transistors having electroluminescent layers.

The TFT test region comprises a plurality of thin film transistors.

Each of the plurality of lead-out lines is used for connecting a source-drain metal layer of one thin film transistor in the electroluminescent layer test region and a source-drain metal layer of one thin film transistor in the TFT test region.

The display effect of the electroluminescent layer in the display panel and the electrical characteristics of the thin film transistor are tested through the peripheral area of the display panel provided by embodiments of the present application. Specifically, the display effect of the electroluminescent layer in the display area can be tested based on the thin film transistors of the electroluminescent layer in the electroluminescent layer test region; the electrical characteristics including short range uniformity and so on of the thin film transistor TFT in the display area can be tested based on the thin film transistors in the TFT test region. The lead-out line is used for leading out the thin film transistors beneath the electroluminescent layer in the electroluminescent test region to the TFT test region, so as to test the electrical characteristics of the TFT. The display effect of the electroluminescent layer in the display panel and the electrical characteristics of the thin film transistor can be evaluated comprehensively based on the display effect of the electroluminescent layer obtained by the electroluminescent layer test region in the peripheral area and the electrical characteristics of the TFT obtained in the TFT test region.

In an embodiment, the thin film transistors having electroluminescent layers in the electroluminescent layer test region are in one-to-one correspondence with the thin film transistors in the TFT test region.

The thin film transistors in the TFT test region are connected with the corresponding thin film transistors beneath the electroluminescent layer in the electroluminescent layer test region through the lead-out line, for testing the electrical characteristics including short range uniformity and so on of the thin film transistors beneath the electroluminescent layer in the electroluminescent layer test region.

In an embodiment, the thin film transistors having electroluminescent layers in the electroluminescent layer test region comprise successively from down to up: a substrate, a buffer layer, a low temperature polysilicon, a gate insulating layer, a gate, an interlayer insulating layer, a source-drain metal electrode, a flat layer, a pixel definition layer and an electroluminescent layer.

The material of the thin film transistors having electroluminescent layers is the same as the material of the thin film transistors in the display area.

In an embodiment, the thin film transistors in the TFT test region comprises successively from down to up: a buffer layer, a gate insulating layer, a gate, an interlayer insulating layer, a source-drain metal electrode, a flat layer and a pixel definition layer.

The material of the thin film transistors in the TFT test region is the same as the material of the thin film transistors in the display area.

Another aspect of the present application provides a method for testing characteristics of TFT using the display panel provided by the present application. The method comprises:

applying a first voltage to the switch lead, such that the thin film transistors in the electroluminescent layer test region are turned on, the thin film transistors in the TFT test region are turned on, and the electroluminescent layer emits light;

applying a second voltage to the switch lead, such that the thin film transistors in the electroluminescent layer test region are cut off, and the thin film transistors in the TFT test region are turned on, measuring electrical characteristics of the thin film transistors in the TFT test region.

The first voltage is a voltage that turns on the thin film transistors, and the second voltage is a voltage that cuts off the thin film transistors.

Through the method for testing characteristics of TFT using the display panel provided by embodiments of the present application, when a first voltage is applied to the switch lead, the thin film transistors in the electroluminescent layer test region are turned on, the thin film transistors in the TFT test region are turned on, the electroluminescent layer emits light, and the light emitting effect of the electroluminescent layer can be evaluated simply and quickly. When a second voltage is applied to the switch lead, the thin film transistors in the electroluminescent layer test region are cut off, the thin film transistors in the TFT test region are turned on, and the electrical characteristics including short range uniformity of the thin film transistors in the TFT test region are tested. Because the thin film transistors in the TFT test region are connected with the thin film transistors having electroluminescent layers in the electroluminescent layer test region through leads, the electrical characteristics of the thin film transistors in the TFT test region are exactly that of the thin film transistors in the electroluminescent layer test region. Therefore, the electrical characteristics of the thin film transistors in the display area can be reflected based on the above measurement result.

In an embodiment, measuring electrical characteristics of the thin film transistors in the TFT test region comprises:

calculating short range uniformity of the thin film transistors in the TFT test region based on a plurality of data, wherein each data is obtained from the following way:

fixing a first probe on the first test line of the electroluminescent layer test region, fixing a second probe on the second test line of the electroluminescent layer test region, placing a third probe in the TFT test region, and moving the third probe within the TFT test region, data being obtained every time the third probe is moved.

A further aspect of the present application provides a manufacturing method of the display panel provided by embodiments of the present application, comprising: manufacturing the peripheral area around the display area while manufacturing the display area.

A switch lead and a second test line are formed when gates of thin film transistors having electroluminescent layers are formed.

A first test line is formed when sources of thin film transistors having electroluminescent layers are formed.

A plurality of lead-out lines are formed when source-drain metal layers of thin film transistors having electroluminescent layers and source-drain metal layers of thin film transistors in the TFT test region are formed.

Through the manufacturing method of the display panel provided by embodiments of the present application, the switch lead is used for controlling turn-on or cut-off of the thin film transistors of the electroluminescent layer test region. The first test line and the second test line are used for measuring electrical characteristics including short range uniformity of the thin film transistors in the TFT test region. The lead-out line connects a source-drain metal layer of the thin film transistor having electroluminescent layers in the electroluminescent layer test region and a source-drain metal layer of the thin film transistor in the TFT test region, so that the electrical characteristics of the thin film transistors in the TFT test region can also reflect the electrical characteristics of the thin film transistors having electroluminescent layers.

In an embodiment, forming thin film transistors having electroluminescent layers in the electroluminescent test region comprises:

forming a buffer layer, a low temperature polysilicon, a gate insulating layer, a gate, an interlayer insulating layer, a source-drain metal electrode, a flat layer, a pixel definition layer and an electroluminescent layer successively on an array substrate of the electroluminescent layer test region of the peripheral area.

In an embodiment, forming thin film transistors in the TFT test region comprises:

forming a buffer layer, a gate insulating layer, a gate, an interlayer insulating layer, a source-drain metal electrode, a flat layer and a pixel definition layer successively on an array substrate of the TFT test region of the peripheral area.

DETAILED DESCRIPTION

Next, the technical solutions in the embodiments of the present application will be described clearly and completely with reference to the drawings in the embodiments of the present application. Apparently, the embodiments described are only a part of, rather than all of the embodiments of the present application. All other embodiments obtained by the ordinary skilled person in the art on the premise of not paying any creative work based on the embodiments in the present application belong to the protection scope of the present application.

Embodiments of the present application provide a display panel and a manufacturing method thereof, as well as a TFT test method, for evaluating the display effect of the electroluminescent layer in the display panel, and the electrical characteristics including short range uniformity and so on of the thin film transistor comprehensively.

Figure 1:
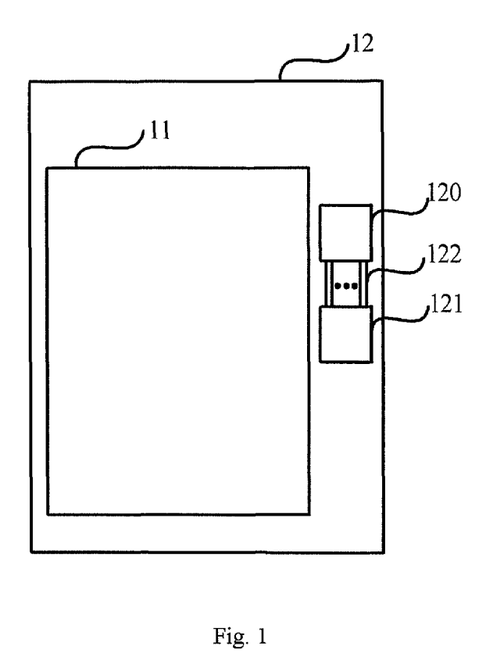
FIG. 1 is a structural schematic view of a display panel provided by embodiments of the present application.

Referring to FIG. 1, a display panel provided by embodiments of the present application comprises a display area 11 and a peripheral area 12 around the display area. The peripheral area 12 comprises: an electroluminescent layer test region 120, a TFT test region 121 and a plurality of lead-out lines 122.

Figure 2:
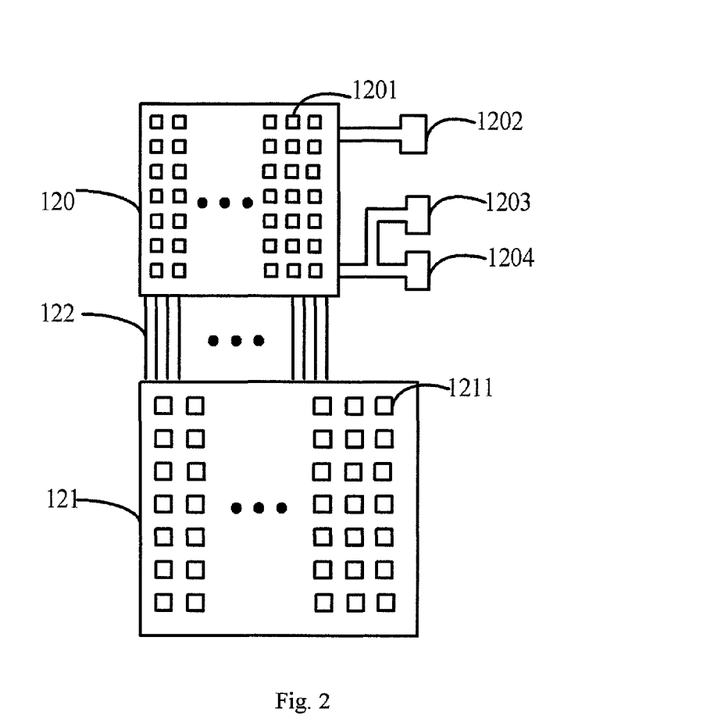
FIG. 2 is a structure schematic view of a peripheral area provided by embodiments of the present application.

Referring to FIG. 2, it shows specific structures of the electroluminescent layer test region 120, the TFT test region 121 and the plurality of lead-out lines 122 in the peripheral area provided by embodiments of the present application. The electroluminescent layer test region 120 comprises a plurality of thin film transistors 1201 having electroluminescent layers, a first test line 1202 connecting sources of the plurality of thin film transistors having electroluminescent layers, and a switch lead 1203 and a second test line 1204 connecting gates of the plurality of thin film transistors having electroluminescent layers. The TFT test region 121 comprises a plurality of thin film transistors 1211. Each of the plurality of lead-out lines 122 is used for connecting a source-drain metal layer of one thin film transistor in the electroluminescent layer test region and a source-drain metal layer of one thin film transistor in the TFT test region.

It should be noted that the arrangement structure of the plurality of thin film transistors in the electroluminescent layer test region provided in embodiments of the present application can be a rectangle or a triangle, which will not be defined specifically in the present application. Also, the arrangement structure of the plurality of thin film transistors in the TFT test region will not be defined specifically either. Although the arrangement structures of the plurality of thin film transistors in the electroluminescent layer test region and the TFT test region provided by embodiments of the present application are explained in detail by taking rectangle as an example, it does not indicate that the arrangement structure is limited to rectangle.

The electroluminescent layer test region, the TFT test region and the lead-out lines in the peripheral area of the display panel provided by embodiments of the present application can be located at any position of the peripheral area, which will not be defined specifically in embodiments of the present application. Although explanation is made specifically in embodiments of the present application by taking the example that the electroluminescent layer test region, the TFT test region and the lead-out lines in the peripheral area are located at right side of the peripheral area, it is not limited to this.

The display effect of the electroluminescent layer in the display panel and the electrical characteristics of the thin film transistor are tested through the peripheral area of the display panel provided by embodiments of the present application. Specifically, the display effect of the electroluminescent layer in the display area can be tested based on the thin film transistors having the electroluminescent layer in the electroluminescent layer test region; the electrical characteristics, including short range uniformity and so on, of the thin film transistor TFT in the display area can be tested based on the thin film transistors in the TFT test region. The lead-out line is used for leading out the thin film transistors beneath the electroluminescent layer in the electroluminescent test region to the TFT test region, so as to test the electrical characteristics of the TFT. The display effect of the electroluminescent layer in the display panel and the electrical characteristics of the thin film transistor can be evaluated comprehensively based on the display effect of the electroluminescent layer obtained by the electroluminescent layer test region in the peripheral area and the electrical characteristics of the TFT obtained in the TFT test region.

The thin film transistors having electroluminescent layers in the electroluminescent layer test region 120 are in one-to-one correspondence with the thin film transistors in the TFT test region 121.

The thin film transistors in the TFT test region are connected with the corresponding thin film transistors beneath the electroluminescent layer in the electroluminescent layer test region through the lead-out line, for testing the electrical characteristics, such as short range uniformity and so on, of the thin film transistors beneath the electroluminescent layer in the electroluminescent layer test region.

Figure 3:
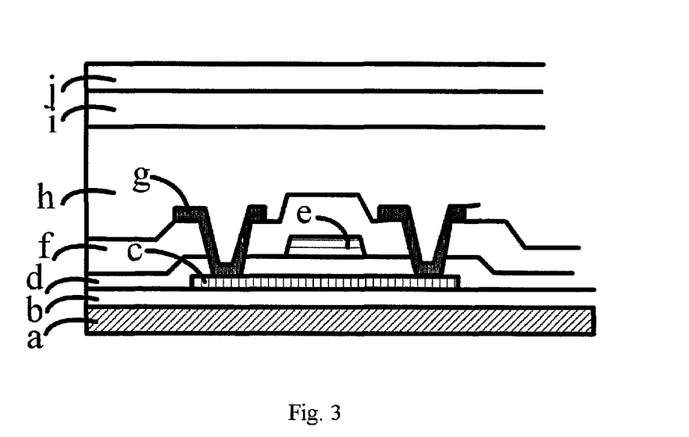
FIG. 3 is a structural schematic view of a thin film transistor having electroluminescent layers provided by embodiments of the present application.

The thin film transistors having electroluminescent layers in the electroluminescent layer test region have the same structure as the thin film transistors in the display area. Referring to FIG. 3, the thin film transistors having electroluminescent layers provided in embodiments of the present application comprise successively from down to up: a substrate a, a buffer layer b, a low temperature polysilicon (p-Si) c, a gate insulating layer d, a gate e, an interlayer insulating layer f, a source-drain metal electrode g, a flat layer h, a pixel definition layer i and an electroluminescent layer j. The material of the thin film transistors having electroluminescent layers is the same as the material of the thin film transistors in the display area.

Figure 4:
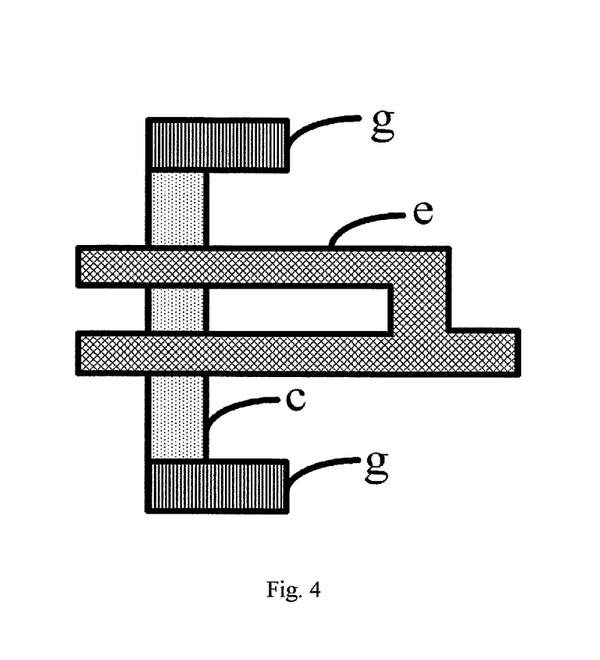
FIG. 4 is a vertical view of a thin film transistor having electroluminescent layers provided by embodiments of the present application.

FIG. 4 is a vertical view of a thin film transistor having electroluminescent layers provide by embodiments of the present application, wherein, e represents the gate, c represents the low temperature polysilicon, g represents the source-drain metal electrode.

Figure 5:
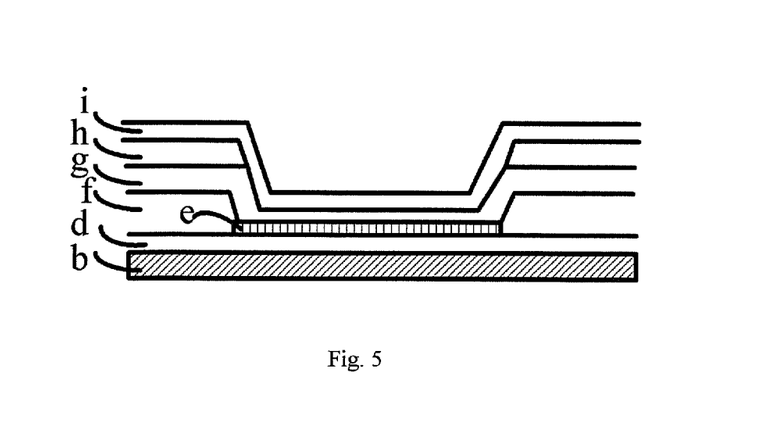
FIG. 5 is a structural schematic view of a thin film transistor in the TFT test region provided by embodiments of the present application.

Referring to FIG. 5, the thin film transistors in the TFT test region comprises successively from down to up: a buffer layer b, a gate insulating layer d, a gate e, an interlayer insulating layer f, a source-drain metal electrode g, a flat layer h and a pixel definition layer i. The material of the thin film transistors in the TFT test region is the same as the material of the thin film transistors in the display area.

The thin film transistors in the TFT test region are used for testing the electrical characteristics, including short range uniformity and so on, of the TFT, so the structure is relatively simple, which is convenient for measurement.

It should be noted that the structure of the thin film transistor provided in embodiments of the present application is the same as the prior art, and the manufacturing process is the same.

Figure 6:
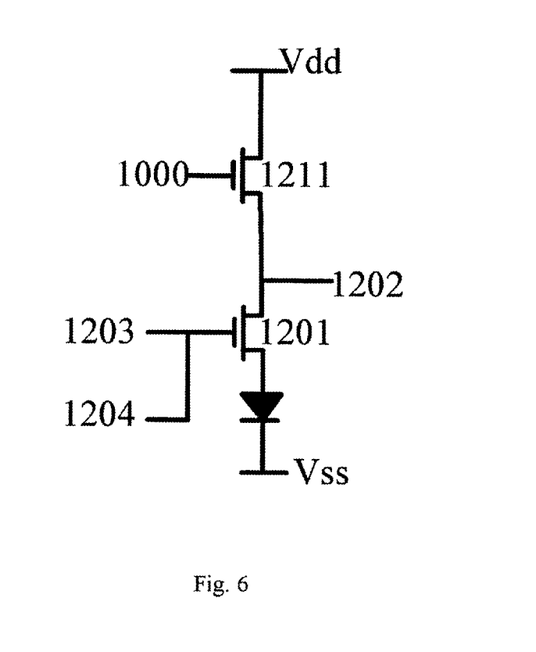
FIG. 6 is a schematic view of principle for testing characteristics of TFT using a display panel provided by embodiments of the present application.

Referring to FIG. 6, embodiments of the present application provides a method for testing characteristic of TFT using the display panel provided by embodiments of the present application. The method comprises:

applying a first voltage to the switch lead 1203, such that the thin film transistors 1201 in the electroluminescent layer test region are turned on, the thin film transistors 1211 in the TFT test region are turned on, and the electroluminescent layer emits light;

applying a second voltage to the switch lead 1203, such that the thin film transistors 1201 in the electroluminescent layer test region are cut off, and the thin film transistors 1211 in the TFT test region are turned on, measuring electrical characteristics of the thin film transistors 1211 in the TFT test region.

The first voltage is a voltage that turns on the thin film transistors, and the second voltage is a voltage that cuts off the thin film transistors. The specific value can be set based on actual needs, which will not be limited in embodiments of the present application.

Leads 1000 connect gates of the thin film transistors in the TFT test region, for providing a turn-on voltage to the thin film transistors in the TFT test region. The connection manner of this voltage is the same as that of the gate voltage of the thin film transistor in the display panel. It will not be defined specifically in embodiments of the present application.

It should be noted that in the method for testing characteristic of TFT using a display panel provided in embodiments of the present application, a first voltage can be applied to the switch lead 1203 firstly, then a second voltage is applied to the switch lead 1203; or a second voltage can be applied to the switch lead 1203 firstly, then a first voltage is applied to the to switch lead 1203. The sequence of the steps in the present application will not be defined specifically.

The thin film transistors are divided into N-type TFT and P-type TFT. No matter which type the thin film transistors are, the first voltage is a gate voltage that turns on the thin film transistors, and the second voltage is a gate voltage that cuts off the thin film transistors.

The gates of the thin film transistors in the TFT test region and the gates of the thin film transistors in the display panel all connect the gate lines.

Through the method for testing characteristics of TFT using the display panel provided by embodiments of the present application, when a first voltage is applied to the switch lead, the thin film transistors in the electroluminescent layer test region are turned on, the thin film transistors in the TFT test region are turned on, the electroluminescent layer emits light, and the light emitting effect of the electroluminescent layer can be evaluated simply and quickly. When a second voltage is applied to the switch lead, the thin film transistors in the electroluminescent layer test region are cut off, the thin film transistors in the TFT test region are turned on, and the electrical characteristics including short range uniformity of the thin film transistors in the TFT test region are tested. Because the thin film transistors in the TFT test region are connected with the thin film transistors having electroluminescent layers in the electroluminescent layer test region through leads, the electrical characteristics of the thin film transistors in the TFT test region are exactly that of the thin film transistors in the electroluminescent layer test region. Therefore, the electrical characteristics of the thin film transistors in the display area can be reflected based on the above measurement result.

Measuring electrical characteristics of the thin film transistors 1211 in the TFT test region comprises:

calculating short range uniformity of the thin film transistors 1211 in the TFT test region based on a plurality of data, wherein each data is obtained from the following way:

fixing a first probe on the first test line 1202 of the electroluminescent layer test region, fixing a second probe on the second test line 1204 of the electroluminescent layer test region, placing a third probe in the TFT test region, and moving the third probe within the TFT test region, one data being obtained every time the third probe is moved.

It should be noted that the method of calculating the electrical characteristics such as short range uniformity of TFT in embodiments of the present application is the same as the method of the prior art, which will not be repeated here.

Certainly, three probes can be used to measure the characteristics of TFT in the display panel provided by embodiments of the present application; other tools can also be used to measure the characteristics of the TFT.

A manufacturing method of a display panel provided by embodiments of the present application comprises: manufacturing the peripheral area around the display area while manufacturing the display area, wherein, a switch lead and a second test line are formed when gates of thin film transistors having electroluminescent layers are formed; a first test line is formed when sources of thin film transistors having electroluminescent layers are formed; a plurality of lead-out lines are formed when source-drain metal layers of thin film transistors having electroluminescent layers and source-drain metal layers of thin film transistors in the TFT test region are formed.

Because the peripheral area provided by embodiments of the present application is used for testing the display effect of the electroluminescent layer in the display area and the electrical characteristics (including short range uniformity and so on) of the thin film transistor, the thin film transistors and the electroluminescent layers in the peripheral area must be the same as those in the display area, so as to ensure accuracy of the test result. Therefore, the display area and the peripheral area of the display panel are manufactured simultaneously, and the structures of the thin film transistors are also the same.

Forming thin film transistors having electroluminescent layers in the electroluminescent test region can comprise:

forming a buffer layer, a low temperature polysilicon, a gate insulating layer, a gate, an interlayer insulating layer, a source-drain metal electrode, a flat layer, a pixel definition layer and an electroluminescent layer successively on an array substrate of the electroluminescent layer test region of the peripheral area.

Forming thin film transistors in the TFT test region can comprise:

forming a buffer layer, a gate insulating layer, a gate, an interlayer insulating layer, a source-drain metal electrode, a flat layer and a pixel definition layer successively on an array substrate of the TFT test region of the peripheral area.

Apparently, the skilled person in the art can make various amendments and modifications to the present application without departing from the spirit and the scope of the present application. In this way, provided that these amendments and modifications of the present invention belong to the scopes of the claims of the present application and the equivalent technologies thereof, the present application also intends to encompass these amendments and modifications.

The invention claimed is:

1. A display panel, comprising a display area and a peripheral area around the display area, wherein the peripheral area comprises: an electroluminescent layer test region, a TFT test region and a plurality of lead-out lines; wherein, the electroluminescent layer test region comprises a plurality of thin film transistors having electroluminescent layers, a first test line connecting sources of the plurality of thin film transistors having electroluminescent layers, and a switch lead and a second test line connecting gates of the plurality of thin film transistors having electroluminescent layers;

the TFT test region comprises a plurality of thin film transistors;

each of the plurality of lead-out lines is used for connecting a source-drain metal layer of one thin film transistor in the electroluminescent layer test region and a source-drain metal layer of one thin film transistor in the TFT test region.

2. The display panel according to claim 1, wherein the thin film transistors having electroluminescent layers in the electroluminescent layer test region are in one-to-one correspondence with the thin film transistors in the TFT test region.

3. The display panel according to claim 1, wherein the thin film transistors having electroluminescent layers in the electroluminescent layer test region comprise successively from down to up: a substrate, a buffer layer, a low temperature polysilicon, a gate insulating layer, a gate, an interlayer insulating layer, a source-drain metal electrode, a flat layer, a pixel definition layer and an electroluminescent layer;

wherein the material of the thin film transistors having electroluminescent layers is the same as the material of the thin film transistors in the display area.

4. The display panel according to claim 1, wherein the thin film transistors in the TFT test region comprises successively from down to up: a buffer layer, a gate insulating layer, a gate, an interlayer insulating layer, a source-drain metal electrode, a flat layer and a pixel definition layer;

wherein the material of the thin film transistors in the TFT test region is the same as the material of the thin film transistors in the display area.

5. A method for testing characteristics of TFT using the display panel as claimed in claim 1, wherein the method comprises:

applying a first voltage to the switch lead, such that the thin film transistors in the electroluminescent layer test region are turned on, the thin film transistors in the TFT test region are turned on, and the electroluminescent layer emits light;

applying a second voltage to the switch lead, such that the thin film transistors in the electroluminescent layer test region are cut off, and the thin film transistors in the TFT test region are turned on, measuring electrical characteristics of the thin film transistors in the TFT test region;

wherein the first voltage is a voltage that turns on the thin film transistors, the second voltage is a voltage that cuts off the thin film transistors.

6. The method for testing characteristics of TFT according to claim 5, wherein measuring electrical characteristics of the thin film transistors in the TFT test region comprises:

calculating short range uniformity of the thin film transistors in the TFT test region based on a plurality of data, wherein each data is obtained from the following way:

fixing a first probe on the first test line of the electroluminescent layer test region, fixing a second probe on the second test line of the electroluminescent layer test region, placing a third probe in the TFT test region, and moving the third probe within the TFT test region, one data being obtained every time the third probe is moved.

7. A manufacturing method of the display panel as claimed in claim 1, characterized by comprising: manufacturing the peripheral area around the display area while manufacturing the display area, wherein, a switch lead and a second test line are formed when gates of thin film transistors having electroluminescent layers are formed;

a first test line is formed when sources of thin film transistors having electroluminescent layers are formed;

a plurality of lead-out lines are formed when source-drain metal layers of thin film transistors having electroluminescent layers and source-drain metal layers of thin film transistors in the TFT test region are formed.

8. The manufacturing method of the display panel according to claim 7, wherein forming thin film transistors having electroluminescent layers in the electroluminescent test region comprises:

forming a buffer layer, a low temperature polysilicon, a gate insulating layer, a gate, an interlayer insulating layer, a source-drain metal electrode, a flat layer, a pixel definition layer and an electroluminescent layer successively on an array substrate of the electroluminescent layer test region of the peripheral area.

9. The manufacturing method of the display panel according to claim 7, wherein forming thin film transistors in the TFT test region comprises:

forming a buffer layer, a gate insulating layer, a gate, an interlayer insulating layer, a source-drain metal electrode, a flat layer and a pixel definition layer successively on an array substrate of the TFT test region of the peripheral area.

10. The method for testing characteristics of TFT according to claim 5, wherein the thin film transistors having electroluminescent layers in the electroluminescent layer test region are in one-to-one correspondence with the thin film transistors in the TFT test region.

11. The method for testing characteristics of TFT according to claim 5, wherein the thin film transistors having electroluminescent layers in the electroluminescent layer test region comprise successively from down to up: a substrate, a buffer layer, a low temperature polysilicon, a gate insulating layer, a gate, an interlayer insulating layer, a source-drain metal electrode, a flat layer, a pixel definition layer and an electroluminescent layer;

wherein the material of the thin film transistors having electroluminescent layers is the same as the material of the thin film transistors in the display area.

12. The method for testing characteristics of TFT according to claim 5, wherein the thin film transistors in the TFT test region comprises successively from down to up:

a buffer layer, a gate insulating layer, a gate, an interlayer insulating layer, a source-drain metal electrode, a flat layer and a pixel definition layer;

wherein the material of the thin film transistors in the TFT test region is the same as the material of the thin film transistors in the display area.

13. The manufacturing method of the display panel according to claim 7, wherein the thin film transistors having electroluminescent layers in the electroluminescent layer test region are in one-to-one correspondence with the thin film transistors in the TFT test region.

14. The manufacturing method of the display panel according to claim 7, wherein the thin film transistors having electroluminescent layers in the electroluminescent layer test region comprise successively from down to up: a substrate, a buffer layer, a low temperature polysilicon, a gate insulating layer, a gate, an interlayer insulating layer, a source-drain metal electrode, a flat layer, a pixel definition layer and an electroluminescent layer;

wherein the material of the thin film transistors having electroluminescent layers is the same as the material of the thin film transistors in the display area.

15. The manufacturing method of the display panel according to claim 7, wherein the thin film transistors in the TFT test region comprises successively from down to up:

a buffer layer, a gate insulating layer, a gate, an interlayer insulating layer, a source-drain metal electrode, a flat layer and a pixel definition layer;

wherein the material of the thin film transistors in the TFT test region is the same as the material of the thin film transistors in the display area.

* * * * *